(12) United States Patent
Suzuki

(10) Patent No.: US 7,950,434 B2
(45) Date of Patent: May 31, 2011

(54) ADHESIVE TAPE ADHERING APPARATUS

(75) Inventor: Masahiro Suzuki, Ebina (JP)

(73) Assignee: Shibaura Mechatronics Corporation (JP)

( * ) Notice: Subject to any disclaimer, the term of this patent is extended or adjusted under 35 U.S.C. 154(b) by 270 days.

(21) Appl. No.: 12/258,634

(22) Filed: Oct. 27, 2008

(65) Prior Publication Data

US 2009/0050274 A1 Feb. 26, 2009

Related U.S. Application Data

(63) Continuation of application No. PCT/JP2007/058674, filed on Apr. 20, 2007.

(30) Foreign Application Priority Data

May 11, 2006 (JP) .................................. 2006-132806

(51) Int. Cl.
*B32B 38/04* (2006.01)
(52) U.S. Cl. ..................... 156/517; 156/580; 156/583.1; 156/247; 156/256
(58) Field of Classification Search .................. 156/510, 156/516, 517, 250, 256, 523, 574, 577, 247, 156/580, 583.1
See application file for complete search history.

(56) References Cited

U.S. PATENT DOCUMENTS

| | | | | |
|---|---|---|---|---|
| 3,883,893 A | * | 5/1975 | Ueki et al. | .................... 360/74.2 |
| 4,551,190 A | * | 11/1985 | Farrow et al. | .................. 156/159 |
| 4,696,707 A | * | 9/1987 | Lewis et al. | ..................... 156/64 |
| 5,492,590 A | | 2/1996 | Sakai | |
| 2005/0183295 A1 | * | 8/2005 | Imai | ................................. 38/14 |

FOREIGN PATENT DOCUMENTS

| | | |
|---|---|---|
| JP | 6243726 | 9/1994 |
| JP | 2003051517 | 2/2003 |
| JP | 2005327923 | 11/2005 |

OTHER PUBLICATIONS

English translation of the International Preliminary Report on Patentability which issued in the parent International Application No. PCT/JP2007/058674.
International Search Report from counterpart International Application No. PCT/JP2007/058674.

* cited by examiner

*Primary Examiner* — Kat Wyrozebski
*Assistant Examiner* — Scott W Dodds
(74) *Attorney, Agent, or Firm* — Volpe and Koenig P.C.

(57) ABSTRACT

An adhering apparatus having a pressurizing tool including a plurality of pressurizing surfaces and rotatably mounted on a base member, a supply reel which supplies a release tape adhered to an adhesive tape along the pressurizing surfaces of a periphery of the pressurizing tool, a cutter which is disposed to face one of the pressurizing surfaces and cuts only the adhesive tape into a predetermined length, and a backup tool supporting a lower surface of the substrate and disposed to face a pressurizing surface located downstream from the pressurizing surface facing the cutter. When the base member is driven downward in the vertical direction, the pressurizing surface facing the backup tool adheres the adhesive tape to the upper surface of the substrate.

8 Claims, 5 Drawing Sheets

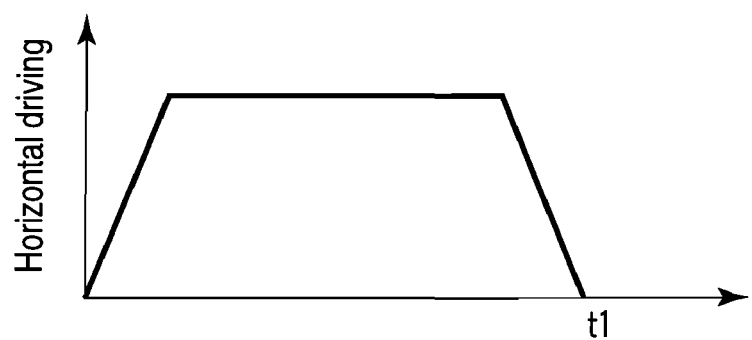
F I G. 6A
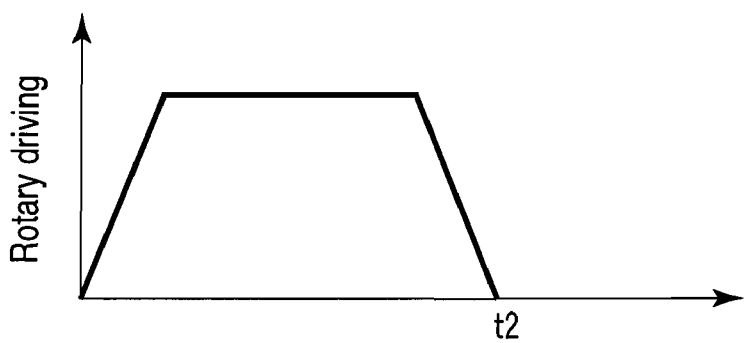
F I G. 6B
F I G. 6C

ADHESIVE TAPE ADHERING APPARATUS

CROSS REFERENCE TO RELATED APPLICATIONS

This is a Continuation Application of PCT Application No. PCT/JP2007/058674, filed Apr. 20, 2007, which was published under PCT Article 21(2) in Japanese.

This application is based upon and claims the benefit of priority from prior Japanese Patent Application No. 2006-132806, filed May 11, 2006, the entire contents of which are incorporated herein by reference.

BACKGROUND OF THE INVENTION

1. Field of the Invention

The present invention relates to an adhesive tape adhering apparatus for adhering adhesive tape to an upper surface of a substrate on which terminals are formed.

2. Description of the Related Art

A process of producing a flat panel display, such as a liquid crystal display panel or a plasma display panel, includes a step of adhering an electronic part, such as a TCP (Tape Carrier Package), to a terminal formed on an upper surface of a glass substrate. An adhesive tape comprising an anisotropic conductive member is used to adhere the electronic part. The anisotropic conductive member is made of thermosetting resin containing metal particles having a diameter in the micrometers range.

Before the electronic part is adhered to the terminal, the adhesive tape is cut into a predetermined length and adhered to the upper surface of the substrate. The adhesive tape is adhered to a release tape and is wound on a supply reel.

After being unreeled from the supply reel the adhesive tape adhered to the release tape is cut by a cutter into the predetermined length. The length of the cut adhesive tape is set to a length corresponding to the electronic part to be adhered to the upper surface of the substrate.

An unnecessary part of the adhesive tape cut by the cutter is removed by removing means. Thereafter, the adhesive tape is pressed by a pressurizing tool onto the upper surface of the substrate, which is supported by a backup tool. This prior art is disclosed in Jpn. Pat. Appln. KOKAI Publication NO. 2003-51517.

According to the conventional configuration, to adhere the adhesive tape to the substrate, it is necessary to sequentially perform the steps of: (1) cutting the adhesive tape adhered to the release tape by means of the cutter, (2) removing the unnecessary part of the cut adhesive tape, and (3) pressing the adhesive tape against the substrate.

Thus, adhesion of the adhesive tape to the substrate requires the sum of time required to perform the aforementioned three steps as a cycle time. Therefore, the cycle time for adhering the adhesive tape to the substrate is long and the productivity is low.

Moreover, in the prior art, the cutting mechanism, the removing means, and the pressurizing mechanism including the pressurizing tool and the backup tool are aligned in line along a horizontal direction. The horizontal direction is the direction of feeding the release tape. Since the length of the overall apparatus along the horizontal direction is long, the apparatus size is inevitably large.

BRIEF SUMMARY OF THE INVENTION

The present invention lies in providing an adhering apparatus for adhesive tape, which can reduce the cycle time and the size of the apparatus.

According to the present invention, there is provided an adhering apparatus for adhering a piece of adhesive tape adhered to release tape and cut into a predetermined length to an upper surface of a side portion of a substrate, the apparatus comprising:

a base member driven in a horizontal direction and a vertical direction;

a pressurizing tool including a polyhedron body, which has a plurality of pressurizing surfaces on a periphery and is rotatably mounted on the base member;

supplying means for supplying the adhesive tape adhered to the release tape along the pressurizing surfaces of the periphery of the pressurizing tool;

a cutter which is disposed to face one of the pressurizing surfaces of the pressurizing tool and cuts only the adhesive tape adhered to the release tape into the predetermined length; and a backup tool which is disposed to face a pressurizing surface located downstream from the pressurizing surface facing the cutter in a direction of rotation of the pressurizing tool, and supports a lower surface of the side portion of the substrate when the base member is driven downward in the vertical direction and adheres the adhesive tape cut into the predetermined length to the upper surface of the substrate by the pressurizing surface.

BRIEF DESCRIPTION OF THE SEVERAL VIEWS OF THE DRAWING

FIG. 6A is a timing chart showing a movement of a pressurizing tool in an X direction.

FIG. 6B is a timing chart showing a movement of the pressurizing tool in a rotational direction.

FIG. 6C is a timing chart showing a movement of the pressurizing tool in an elevating direction.

DETAILED DESCRIPTION OF THE INVENTION

An embodiment of the present invention will be described with reference to the drawings.

Figure 1:
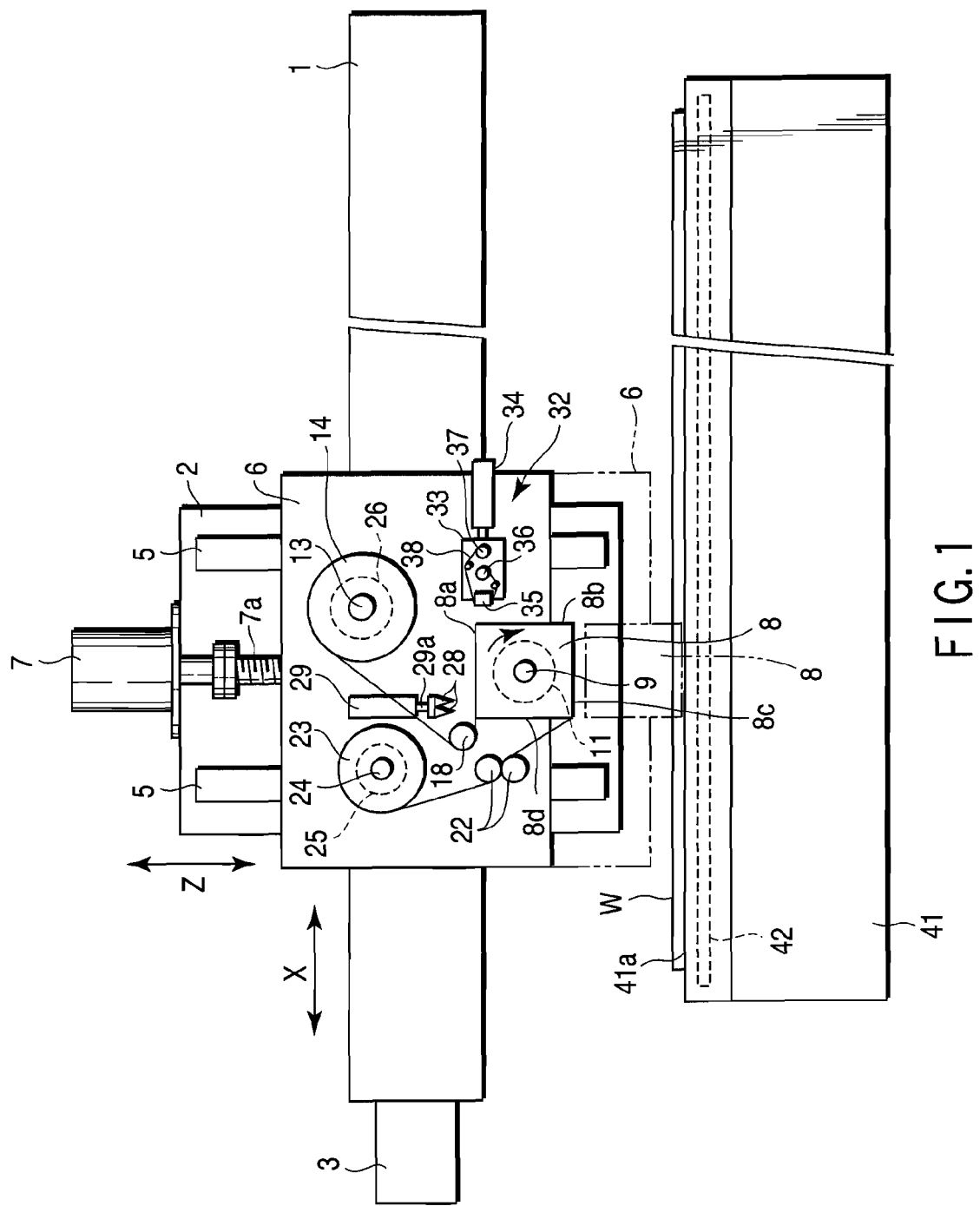
FIG. 1 is a schematic structural diagram showing an adhering apparatus according to an embodiment of the present invention.

An adhering apparatus according to this invention shown in FIG. 1 has an X guide body 1 disposed horizontally. An X base member 2, which has a rectangular plate shape, is mounted on the X guide body 1 so as to be movable along the X direction indicated by an arrow in this figure. An X drive source 3 is mounted on one end of the X guide body 1, and the base member 2 is driven in the X direction by the X drive source On a front surface of the X base member 2, a pair of rail-shaped Z guide bodies, which are spaced at a predetermined distance, is provided along a Z direction (vertical direction) indicated by an arrow in FIG. 1. A Z base member 6 is mounted on the Z guide bodies so as to be movable in the Z direction. A Z drive source 7 is mounted on an upper end of the X base member 2. The Z member 6 is driven in the Z direction by a screw shaft 7a, which is rotated by the Z drive source 7.

A pressurizing tool 8 is rotatably disposed on a lower part of the front surface of the Z base member 6 via a first support shaft 9. The pressurizing tool 8 is a polyhedron having a rectangular front surface. A peripheral surface of the pressurizing tool constitutes four, first to fourth, pressurizing surfaces 8a to 8d to adhere adhesive tape 16 (described later) to an upper surface of a side portion of a substrate W in accordance with a rotary position thereof. A first rotary drive source 11, which rotates the pressurizing tool 8, is disposed on a rear surface of the Z base member 6 via the first support shaft 9.

A second support shaft 13 is rotatably mounted on the front surface of the Z base member 6 on a part above the pressurizing tool 8. A supply reel 14 is attached to the second support shaft 13 detachably and rotatably together with the second support shaft 13 integrally.

Figure 2:
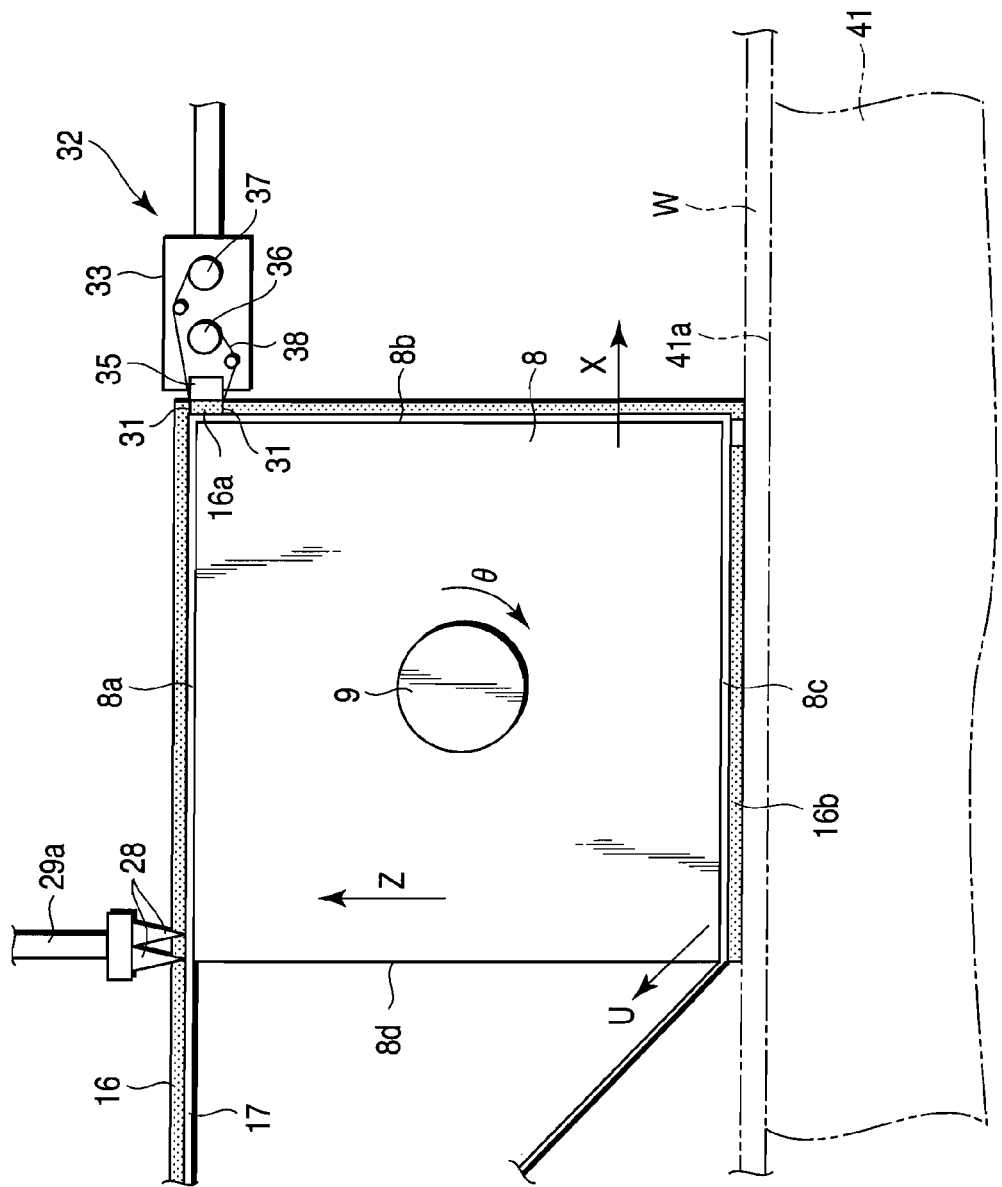
FIG. 2 is an enlarged front view of a pressurizing member, showing a state of simultaneously performing the steps of cutting the adhesive tape by a cutter, removing an unnecessary cut part and adhering the part cut into a predetermined length to a substrate.

Release tape 17, together with adhesive tape 16 which is made of anisotropic conductive tape and adheres to one surface the release tape as shown in FIG. 2, is wound around the supply reel 14. The release tape 17 unreeled from the supply reel 14 together with the adhesive tape 16 is guided by a first guide roller 18 and wrapped around the peripheral surface of the pressurizing tool 8 clockwise with the adhesive tape 16 directed outward.

Specifically, as shown in FIGS. 1 and 2, when the pressurizing tool 8 is at a rotation angle where the first pressurizing surface 8a is located at the top, the release tape 17 is sequentially wrapped around the three, first to third, pressurizing surfaces 8a to 8c of the first to fourth pressurizing surfaces 8a to 8d of the pressurizing tool 8. Then, the release tape 17 is led out from the third pressurizing surface 8c located below.

Before the release tape 17 is led out from the third pressurizing surface 8c, the adhesive tape 16 is cut into a predetermined length and adhered to the substrate W as described later and thus removed from the release tape 17. The release tape 17, removed from the adhesive tape 16, is led out from the third pressurizing surface 8c and pinched and guided by a pair of second guide rollers 22 and wound around a take-up reel 23.

Instead of the pair of second guide rollers 22, a single second guide roller may be used, depending on the position of the take-up reel 23 provided in the Z base member 6.

A third support shaft 24 is rotatably disposed on the Z base member 6. The take-up reel 23 is attached to an end of the third support shaft 24 projecting from the front surface of the Z base member 6 so as to be detachable and integrally rotatable. A second rotary drive source, which rotates the third support shaft 24, is mounted on the rear surface of the Z base member 6.

The second support shaft 13, to which the supply reel 14 is attached, is provided with a torque motor 26, which serves as slack removing means for applying a predetermined torque to the supply reel 14 via the support shaft 13. When the predetermined torque is applied to the supply reel 14 by the torque motor 26, resistance occurs in the release tape 17 which is unreeled from the supply reel 14 along with the adhesive tape 16.

As a result, when the release tape 17 is unreeled from the supply reel 14 as will be described later, the release tape 17 is prevented from being unreeled more than necessary and accordingly slacked because of excessive rotation of the supply reel 14.

A pair of cutters 28, spaced at a predetermined distance from each other, are disposed on the Z base member 6. The pair of cutters 28 are arranged such that sharp blades thereof face an end portion of the first pressurizing surface 8a, when the pressurizing tool 8 is located at the rotation angle shown in FIG. 2, that is, when the first pressurizing surface 8a is located horizontally at the top. The pair of cutters 28 are driven in a direction approaching the first pressurizing surface 8a by a first cylinder 29 as a drive source.

The first cylinder 29 is provided in a position different from the release tape 17 relative to the plate surface of the Z base member 6 so as not to interfere with the release tape 17 unreeled from the supply reel 14. The pair of cutters 28 are connected to a rod 29a of the first cylinder 29 so that only it is located above the release tape 17 wrapped around the pressurizing tool 8.

Figure 3A:
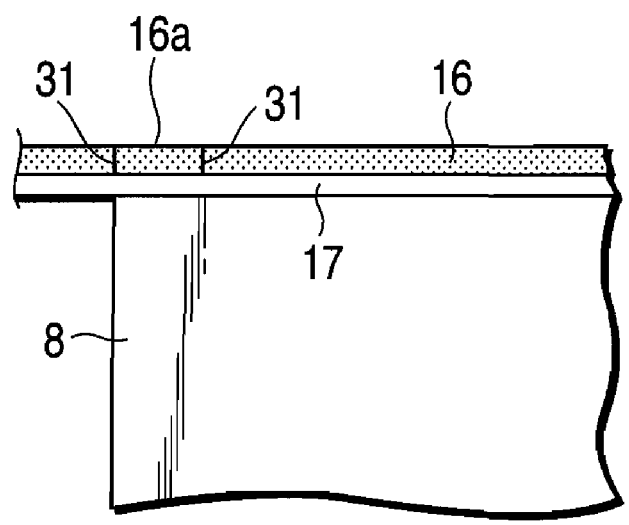
FIG. 3A is an enlarged view showing a part of an adhesive tape in which a pair of cutting lines is formed.

A stroke of the cutters 28 by the first cylinder 29 is set to cut only the adhesive tape 16, which is located on the outer side, of the release tape 17 and the adhesive tape 16 fitted to the first pressurizing surface 8a. As a result, a pair of cut lines 31 spaced at an interval is formed only in the adhesive tape 16 by the pair of cutters 28 as shown in FIG. 3A. The part of the adhesive tape 16 between the pair of cut lines 31 is an unnecessary part 16a, which is removed as will be described later.

A removing mechanism 32, as a removing means for removing the unnecessary part 16a (shown in FIGS. 1 and 2) cut from the adhesive tape 16 by the pair of cutters 28, is disposed at a position facing an upper end portion of the second pressurizing surface 8b adjacent to the right end of the first pressurizing surface 8a of the pressurizing tool 8.

The removing mechanism 32 has a slide plate 33 mounted to be movable with respect to the Z base member 6 along the X direction. The slide plate 33 is driven in the X direction by a second cylinder 34.

As shown in FIGS. 1 and 2, a removing head 35 having a width substantially the same as the distance between the cutters 28 is disposed at a distal end of the slide plate 33. An adhesive removing tape 38, which is unreeled from a supply reel 36 and reeled up by a take-up reel 37, runs to the distal end face of the peeling head 35.

As shown in FIG. 2, the pair of cut lines 31 is formed in the adhesive tape 16 by the pair of cutters 28 disposed to face the first pressurizing surface 8a of the pressurizing tool 8.

Rotation of the pressurizing tool 8 by 90 degrees clockwise by means of the first rotary drive source 11 as indicated by the arrow in FIG. 1 causes the unnecessary part 16a of the adhesive tape 16 to come to face the removing head 35 of the removing mechanism 32.

In that state, the removing mechanism 32 is driven by the second cylinder 34 in a direction toward the pressurizing tool 8. As a result, the removing head 35 of the removing mechanism 32 is pressed against the unnecessary part 16a of the adhesive tape 16 via the peeling tape 38.

Figure 3B:
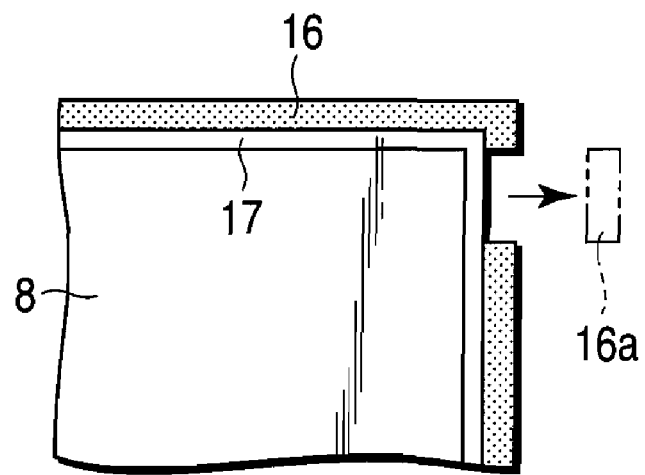
FIG. 3B is an enlarged view showing the part from which the unnecessary part cut by the cutting lines is removed.

Then, the removing mechanism 32 is driven away from the pressurizing tool 8 by the second cylinder 34. As a result, as shown in FIG. 3B, the unnecessary part 16a of the adhesive tape 16 is removed from the release tape 17 by the removing tape 38.

As shown in FIGS. 1 and 2, a backup tool 41 is disposed under the pressurizing tool 8 to face the third pressurizing surface 8c of the pressurizing tool 8. The backup tool 41 has an elongate shape extending in the X direction. A substrate W for use in a liquid crystal display panel or the like is conveyed to an upper surface 41a by a conveyor table not shown.

One side of the bottom surface in the width direction of the substrate W conveyed by the conveyor table is supported by the upper surface 41a of the backup tool 41. A heater 42, which heats the one side of the substrate W supported by the upper end surface 41a, is provided in an upper portion of the backup tool 41.

The pressurizing tool 8 is intermittently rotated by 90 degrees clockwise by means of the first rotary drive source 11. When the part 16b cut into a predetermined length of the adhesive tape 16, from which the unnecessary part 16a has been removed, is conveyed to a position facing the upper surface 41a of the backup tool 41 as shown in FIG. 2, the Z base member 6 is driven by the Z drive source 7 from a raised position indicated by the solid line in FIG. 1 to a lowered position indicated by the chained line.

As a result, the cut part 16b of the predetermined length of the adhesive tape 16 is pressed onto the upper surface of the substrate W by a pressurizing surface (the third pressurizing surface 8c in FIG. 2) of the pressurizing tool 8. In that time, the adhesive tape 16 is heated by the heater 42 provided in the upper portion of the backup tool 41 via the substrate W. Accordingly, the adhesive tape 16 is heated to such an extent as to melt, but not to harden, and adhere to the substrate W by thermocompression.

When the adhesive tape is adhered by thermocompression, the heat of the heater 42 may be transmitted to the pressurizing tool 8, and the part of the adhesive tape 16 wrapped around the pressurizing tool 8, other than the cut part 16b, may be thermally affected. To prevent this, the pressurizing tool 8 may be cooled by cooling means, such as compressed air.

Figure 4:
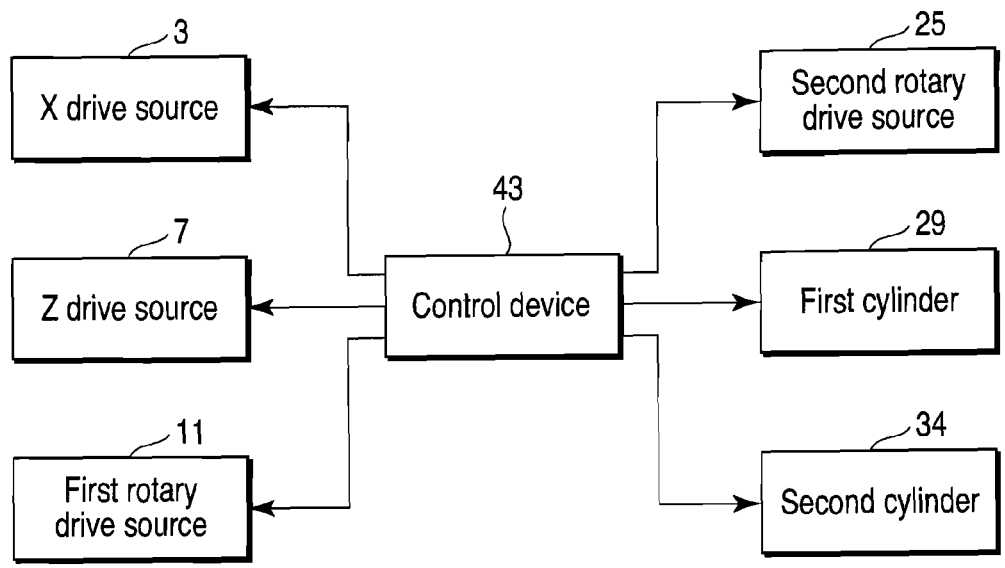
FIG. 4 is a block diagram showing a control system of the adhering apparatus.

FIG. 4 is a block diagram showing a control system having the control device 43. The control device 43 controls driving of the X drive source 3, the Z drive source 7, the first rotary drive source 11, the second rotary drive source, the first cylinder 29 and the second cylinder 34 at predetermined timings.

Specifically, when the release tape 17 is wrapped around the three pressurizing surfaces of the pressurizing tool 8, for example, the first to third pressurizing surfaces 8a to 8c as shown in FIG. 2, the control device 43 controls driving of the cutters 18, the removing mechanism 32 and the pressurizing tool 8 in the Z direction to perform simultaneously cutting of the adhesive tape 16 by the pair of cutters 28 facing the first pressurizing surface 8a, removing of the unnecessary part 16a of the adhesive tape 16 by the removing mechanism 32 facing the second pressurizing surface 8b, and adhering the cut part 16b of the adhesive tape onto the substrate W by thermocompression.

When the pressurizing tool 8 is driven in the downward direction together with the Z base member 6 and adheres the cut part 16b of the adhesive tape 16 to the upper surface of the substrate W by thermocompression, the control device 43 performs synchronous control of the clockwise rotary driving, upward driving and horizontal driving in the X direction of the pressurizing tool 8 and the rotary driving of the take-up reel 23 which reels up the release tape 17, so that the release tape 17 can be smoothly peeled off from the cut part 16b of the adhesive tape 16.

FIGS. 6A, 6B and 6C are timing charts respectively showing the horizontal driving, rotary driving and upward driving of the pressurizing tool 8. The release tape 17 is peeled from the cut part 16b of the adhesive tape 16, as will be described later, by controlling the driving of the pressurizing tool 8 and the reel-up movement by the take-up reel 23 for reeling up the release tape 17.

Specifically, when the cut part 16b has been adhered to the upper surface of the side portion of the substrate W by lowering the pressurizing tool 8, the horizontal driving of the pressurizing tool 8 indicated by the arrow X in FIG. 2, the clockwise rotary driving thereof indicated by the arrow θ and the upward driving thereof indicated by the arrow Z are simultaneously started. At the same time, the take-up reel 23 is rotated to start reeling up the release tape 17.

Assuming that the time when the horizontal driving of the pressurizing tool 8 is completed is t1 as shown in FIG. 6A, the rotary driving is completed at t2 before the completion of the horizontal driving as shown in FIG. 6B, and the upward driving is completed at t3 after the completion of the horizontal driving as shown in FIG. 6C.

As a result, the pressurized state of the release tape 17 by the pressurizing surface 8c of the pressurizing tool 8 is released and a portion of the release tape 17 adhering to one end of the cut part 16b of the adhesive tape 16 is pulled upward in a slanting direction as indicated by the arrow U. Therefore, the release tape 17 is gradually peeled off from the one end of the cut part 16b toward the other end.

Conventionally, a special-purpose mechanism for peeling was used to peel off the release tape 17 from the adhesive tape 16 adhering to the substrate W. However, according to the embodiment of the present invention, as described above, the release tape 17 can be peeled off from the cut part 16b of the adhesive tape 16 adhering to the substrate W by controlling the horizontal driving, rotary driving and upward driving of the pressurizing tool 8 and the driving of the takeup reel 23 which reels up the release tape 17 without using a special-purpose mechanism for peeling the release tape 17.

In addition, the movement of the pressurizing tool 8 in the horizontal direction, rotary direction and upward direction during the peeling of the release tape 17 is movement to next adhere the cut part 16b of the adhesive tape 16 to the substrate W. For this reason also, the cycle time can be reduced as compared to the conventional art in which the peeling of the release tape 17 is performed as an independent operation.

Figure 5:
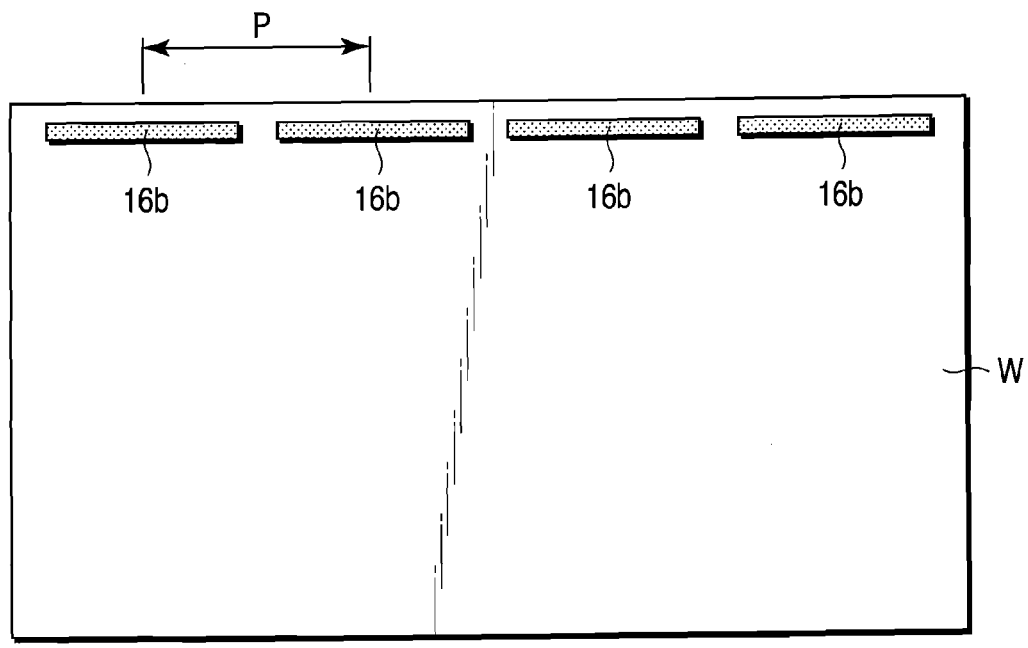
FIG. 5 is a plan view showing a state of a plurality of adhesive tape pieces cut into a predetermined length adhered at regular pitches on a side portion of the substrate.

When the cut part 16b of the adhesive tape 16 has been adhered to the upper surface of the substrate W and the release tape 17 has been peeled from that portion, the pressurizing tool 8 driven by the X drive source 3 in the X direction along with the X base member 2 is positioned in a predetermined position. At that position, a work of adhering the cut part 16b of the adhesive tape 16 cut into the predetermined length to the upper surface of the side portion of the substrate W is repeated. As a result, cut parts 16b of the predetermined length are adhered to the upper surface of the side portion of the substrate W by thermocompression at predetermined pitches P, as shown in FIG. 5.

With the adhering apparatus having the above configuration, the three steps required to adhere the adhesive tape 16 to the substrate W by thermocompression include, cutting the adhesive tape 16 by means of the cutters 28, removing the unnecessary part 16a from the cut adhesive tape 16, and adhering the adhesive tape 16 cut into the predetermined length to the substrate W. These steps can be performed simultaneously by the use of three of the four pressurizing surfaces 8a to 8d of the pressurizing tool 8.

Accordingly, the cycle time required for adhering the adhesive tape 16 can be significantly reduced as compared to the conventional art in which the aforementioned three steps are performed one after another.

Moreover, the cutters 28, the removing mechanism 32 and the backup tool 41 are arranged along the direction of rotation of the pressurizing tool 41. Thus, since these members are arranged around the pressurizing tool 8, the length of the apparatus can be reduced as compared to the conventional device in which the members are arranged in line. Consequently, the apparatus can be downsized.

The heater 42 to heat the adhesive tape 16 is provided in an upper portion of the backup tool 41. Thus, since the adhesive tape 16 is heated only when it is pressurized by one pressurizing surface of the pressurizing tool 8 and adhered to the substrate W, it is not substantially susceptible to heat of the heater 42 before it is adhered.

According to the conventional art, a heater has been provided in the pressurizing tool. For this reason, since the adhesive tape 16 is continuously susceptible to heat for a long time, it is hardened and its adhesiveness is impaired before it is adhered to the substrate W. Consequently, thermocompression may not be ensured.

To avoid this, in the case where the pressurizing tool is provided with the heater, conventionally, a heat resistance tape is interposed between the pressurizing tool and the release tape 17, so that the adhesive tape adhering to the release tape 17 may not be susceptible to the heater in the pressurizing tool. Thus, since the heat insulating tape is required, the configuration is complicated and the cost is increased.

In contrast, according to the embodiment of the present invention, since the heater 42 is provided in the backup tool 41, the adhesive tape 16 is prevented from heat effect before it is adhered to the substrate W, even if heat insulating tape is not used. Therefore, the configuration of the apparatus is simple and the cost can be suppressed.

The pressurizing tool has a rectangular shape with the four pressurizing surfaces 8a to 8d on the peripheral surface of the pressurizing tool. Therefore, when the aforementioned three steps to adhere the adhesive tape 16 to the substrate W are simultaneously performed, one pressurizing surface is not used.

The release tape 17 unreeled from the supply reel 14 is led into the pressurizing tool 8 through one end of the pressurizing surface not in use to the pressurizing surface in use (the pressurizing surface facing the cutters 28). Then, the cut part 16b of the adhesive tape 16 is removed from the other end of the pressurizing surface not in use and the release tape 17 to be reeled up by the take-up reel 23 is led out.

In other words, since one of the four pressurizing surfaces 8a to 8d is not in use and stands idle, the lead-in side and the lead-out side of the release tape 17 do not interfere with each other because of the length of the pressurizing surface not in use. Accordingly, the release tape 17 can be smoothly unreeled from the supply reel 14 and reeled up by the take-up reel 23 without fail.

The supply reel 14 is given a predetermined torque by the torque motor 26. Therefore, when the pressurizing tool 8 is rotated clockwise and the release tape 17 is unreeled from the supply reel 14, tension in accordance with the torque of the torque motor 26 is applied to the unreeled release tape 17.

Accordingly, when the pressurizing tool 8 is rotated, the tension applied to the release tape 17 prevents the supply reel 14 from being rotated more than necessary. Therefore, the release tape 17 is prevented from being unreeled more than necessary and being slacked because of excessive rotation of the supply reel 14.

If the release tape 17 is slacked, the position of the adhesive tape 16 cut by the cutters 28 may vary, resulting in a difference in length between the cut parts 16b of the adhesive tape. However, since the release tape 17 is prevented from slack by the torque motor 26, the cutting by the cutters 28 can be performed accurately without variations in length of the cut parts 16b.

The pressurizing tool 8 is movable in the X direction by the X base member 2 and also in the Z direction by the Z base member 6. The driving in the X direction and the Z direction is controlled by the control device 43.

For this reason, a plurality of pieces of the adhesive tape 16 cut into the predetermined length, i.e., the cut parts 16b, can be successively adhered to the upper surface of the side portion of the substrate W at predetermined pitches P along the longitudinal direction of the side portion. Therefore, a plurality of electronic parts can efficiently be adhered at the pitches to the upper surface of the side portion of the substrate W.

Conventionally, a plurality of pressurizing tools arranged in a line have been used to adhere a plurality of pieces of the adhesive tape 16 to one side portion of the substrate W. According to the embodiment described above, a plurality of cut parts 16b can be successively adhered by one pressurizing tool 8. This also contributes to the downsizing of the apparatus.

Further, after the cut part 16b of the adhesive tape is adhered to the upper surface of the side portion of the substrate W, the driving of the pressurizing tool 8 in the horizontal direction, the rotary direction and the upward direction and the driving of the take-up reel 23 are controlled synchronously, so that the release tape 17 can be peeled off from the cut part 16b without fail.

Accordingly, a special-purpose mechanism for peeling off the release tape 17 need not be used, which also contribute to the simple configuration and reduction in the cycle time.

The length of a piece of the adhesive tape 16 to be adhered to the substrate W can be set by changing the size of the pressurizing tool 8, that is, the length of the pressurizing surfaces 8a to 8d of the pressurizing tool 8.

Although the shape of the front face of the pressurizing tool 8 is a rectangle, it may be a pentagon or any other polygon.

In the above description, two cut lines 31 are formed in the adhesive tape 16 by the pair of cutters 28 and the unnecessary part 16a between the two cut lines 31 in the adhesive tape is removed by the removing mechanism 32. However, one cut line may be formed by one cutter 28 so as not to form an unnecessary part 16a in the adhesive tape 16, and the cut part 16b cut into a predetermined length may be adhered to the substrate W by the rotation of the pressurizing tool 8.

With this configuration, since there is no unnecessary part 16a in the adhesive tape 16, the adhesive tape 16 can be used efficiently without waste.

According to this invention, since the pressurizing tool can be a polyhedron having a plurality of pressurizing surfaces, it is possible to dispose a cutter which cuts the adhesive tape and a backup tool which supports the substrate when the cut adhesive tape is pressed against and adhered to the substrate by the pressurizing surface of the pressurizing tool along the direction of rotation of the pressurizing tool.

Therefore, the cutting of the adhesive tape and the adhering of the cut adhesive tape to the substrate can be performed simultaneously by using a plurality of pressurizing surfaces of the pressurizing tool. Thus, the cycle time required to adhere the adhesive tape to the substrate can be reduced. In addition, the space in the horizontal direction for disposing the cutter and the backup tool can be reduced, so that the apparatus can be downsized.

What is claimed is:

1. An adhering apparatus for adhering a piece of adhesive tape adhered to a release tape and cut into a predetermined length to an upper surface of a substrate, the apparatus comprising:
  a base member driven in a horizontal direction and a vertical direction;

a pressurizing tool including a polyhedron body with a plurality of peripheral pressurizing surfaces, the pressurizing tool rotatably mounted on the base member;

a supply member supplying the adhesive tape adhered to the release tape along the peripheral pressurizing surfaces;

a cutter disposed to face one of the peripheral pressurizing surfaces, the cutter cutting only the adhesive tape into pieces having a predetermined length;

a backup tool disposed to face one of the peripheral pressurizing surfaces located downstream from the peripheral pressurizing surface facing the cutter in a direction of rotation of the pressurizing tool, the backup tool supporting a lower surface of the substrate;

wherein the base member is driven downward in the vertical direction toward the substrate during a first period during which the peripheral pressurizing surface facing the backup tool adheres the adhesive tape piece to the upper surface of the substrate;

and the base member is driven upward in the vertical direction away from the substrate during a second period, within the second period, the base member is also driven a predefined length in the horizontal direction and the pressurizing tool is rotatably driven such that the peripheral pressurizing surface upstream from the peripheral pressurizing surface facing the backup tool during the first period is rotated to face the backup tool;

and wherein the base member includes a take-up reel which reels up the release tape, which has been removed from the adhesive tape following adhesion of the adhesive tape piece to the substrate.

2. The adhering apparatus according to claim 1, further comprising a removing mechanism that removes an unnecessary part of the adhesive tape cut by the cutter from the release tape, the removing mechanism being disposed to face one of the peripheral pressurizing surfaces located downstream from the peripheral pressurizing surface facing the cutter in the direction of the rotation of the pressurizing tool and upstream from the peripheral pressurizing surface facing the backup tool.

3. The adhering apparatus according to claim 1, wherein the backup tool includes a heater which heats the substrate and the adhesive tape piece when the adhesive tape piece is adhered to the upper surface of the substrate.

4. The adhering apparatus according to claim 1, wherein the pressurizing tool has a rectangular shape having four peripheral pressurizing surfaces and is rotatable by 90 degrees.

5. The adhering apparatus according to claim 1, wherein the supply member comprises a supply reel on which the release tape adhered to the adhesive tape is reeled, the release tape adhered to the adhesive tape is unreeled from the supply reel by the rotation of the pressurizing tool, and the supply reel includes a slack removing member that prevents the release tape unreeled from the supply reel from being slacked.

6. The adhering apparatus according to claim 1, further comprising a control that drives the base member in the horizontal direction and the vertical direction to adhere the adhesive tape pieces to the upper surface of the substrate at predetermined intervals along a longitudinal direction of the upper surface.

7. The adhering apparatus according to claim 1, further comprising a control that controls movement of the pressurizing tool in the horizontal direction, the vertical direction and the rotary direction and rotation of the take-up reel which reels after the base member has been moved downward in the vertical direction and the adhesive tape piece has been adhered to the upper surface of the substrate.

8. An adhering apparatus for adhering a piece of adhesive tape adhered to a release tape and cut into a predetermined length to an upper surface of a substrate, the apparatus comprising:

a base member driven in a horizontal direction and a vertical direction;

a pressurizing tool including a polyhedron body with a plurality of peripheral pressurizing surfaces, the pressurizing tool rotatably mounted on the base member;

a supply member supplying the adhesive tape adhered to the release tape along the peripheral pressurizing surfaces;

a cutter disposed to face one of the peripheral pressurizing surfaces, the cutter cutting only the adhesive tape into pieces having a predetermined length;

a backup tool disposed to face one of the peripheral pressurizing surfaces located downstream from the peripheral pressurizing surface facing the cutter in a direction of rotation of the pressurizing tool, the backup tool supporting a lower surface of the substrate; and a removing mechanism that stores an unnecessary part of the adhesive tape cut by the cutter from the release tape, the removing mechanism being disposed to face one of the peripheral pressurizing surfaces located downstream from the peripheral pressurizing surface facing the cutter in the direction of the rotation of the pressurizing tool and upstream from the peripheral pressurizing surface facing the backup tool;

wherein when the base member is driven downward in the vertical direction, the peripheral pressurizing surface facing the backup tool adheres the adhesive tape piece to the upper surface of the substrate.

* * * * *